United States Patent
Lee et al.

(10) Patent No.: US 8,878,221 B2
(45) Date of Patent: Nov. 4, 2014

(54) LIGHT EMITTING MODULE

(75) Inventors: Gun Kyo Lee, Seoul (KR); Jong Woo Lee, Seoul (KR); Yun Min Cho, Seoul (KR)

(73) Assignee: LG Innotex Co., Ltd., Seoul (KR)

(*) Notice: Subject to any disclaimer, the term of this patent is extended or adjusted under 35 U.S.C. 154(b) by 216 days.

(21) Appl. No.: 13/412,979

(22) Filed: Mar. 6, 2012

(65) Prior Publication Data

US 2013/0044477 A1    Feb. 21, 2013

(30) Foreign Application Priority Data

Aug. 19, 2011 (KR) .......... 10-2011-0082885
Sep. 7, 2011 (KR) .......... 10-2011-0090758

(51) Int. Cl.
*H01L 33/00* (2010.01)
*F21S 8/10* (2006.01)
*H01L 25/075* (2006.01)
*H01L 33/64* (2010.01)

(52) U.S. Cl.
CPC ........... *H01L 25/0753* (2013.01); *F21S 48/321* (2013.01); *F21S 48/328* (2013.01); *F21S 48/215* (2013.01); *H01L 33/64* (2013.01); *F21S 48/115* (2013.01)
USPC ........................................................ 257/99

(58) Field of Classification Search
USPC ............... 362/294, 373; 361/767, 768, 770; 313/500; 257/99
See application file for complete search history.

(56) References Cited

U.S. PATENT DOCUMENTS

| | | | |
|---|---|---|---|
| 7,521,724 B2* | 4/2009 | Chen et al. ................ | 257/95 |
| 2004/0065894 A1* | 4/2004 | Hashimoto et al. ......... | 257/100 |
| 2004/0227145 A1* | 11/2004 | Abe et al. .................. | 257/98 |
| 2008/0006837 A1* | 1/2008 | Park et al. .................. | 257/98 |
| 2009/0026485 A1* | 1/2009 | Urano et al. ................ | 257/99 |
| 2011/0019417 A1* | 1/2011 | Van Laanen et al. ..... | 362/249.02 |
| 2011/0303941 A1* | 12/2011 | Lee ............................ | 257/98 |
| 2011/0309404 A1* | 12/2011 | Lee ............................ | 257/99 |
| 2012/0007076 A1* | 1/2012 | Cho ............................ | 257/48 |
| 2012/0012880 A1* | 1/2012 | Lee et al. .................... | 257/98 |
| 2012/0126280 A1* | 5/2012 | Lee ............................ | 257/99 |

FOREIGN PATENT DOCUMENTS

WO    WO 2005083804 A1 *    9/2005

* cited by examiner

*Primary Examiner* — John A Ward
(74) *Attorney, Agent, or Firm* — Birch, Stewart, Kolasch & Birch, LLP

(57) ABSTRACT

Disclosed herein is a light emitting module. The light emitting module according to an exemplary embodiment includes a circuit board having a cavity and including a circuit pattern at a region which does not have the cavity, an insulation substrate disposed in the cavity while being formed, at an upper portion thereof, with at least one pad, and at least one light emitting device disposed on the pad, wherein a joining structure is disposed between a bottom surface of the cavity and a bottom surface of the insulation substrate.

20 Claims, 11 Drawing Sheets

250

LIGHT EMITTING MODULE

CROSS REFERENCE TO RELATED APPLICATION

This application claims priority under 35 U.S.C. §119 to Korean Patent Application No. 10-2011-0082885, filed in Korea on Aug. 19, 2011 and No. 10-2011-0090758, filed in Korea on Sep. 7, 2011, which are hereby incorporated in its entirety by reference as if fully set forth herein.

TECHNICAL FIELD

Embodiments relate to a light emitting module.

BACKGROUND

In general, a circuit board is formed with circuit patterns on an electric insulation substrate with a conductive material such as copper (Cu) and refers to a board prior to mounting of electronic component-related heating elements. Heating elements, such as a semiconductor element, a Light Emitting Diode (LED), and the like, are mounted on the above-mentioned circuit board.

The circuit board on which the LED is mounted is particularly being developed for a head lamp of a vehicle, and thus heat resistance and heat transfer characteristics are required.

However, the elements such as the LED and the like radiate considerable heat. Therefore, if the heat is not dissipated from the circuit board on which the heating elements are mounted, the temperature of the circuit board on which the heating elements are mounted increases, thereby deteriorating product reliability in addition to causing breakdown and malfunction of the heating elements.

SUMMARY

Embodiments provide a light emitting module having improved heat radiating characteristics.

In one embodiment, a light emitting module includes a circuit board having a cavity and including a circuit pattern at a region which does not have the cavity, an insulation substrate disposed in the cavity while being formed, at an upper portion thereof, with at least one pad, and at least one light emitting device disposed on the pad, wherein a joining structure is disposed between a bottom surface of the cavity and a bottom surface of the insulation substrate.

The joining structure may include at least one cavity recess portion formed to be recessed from the bottom surface of the cavity and at least one insulation substrate protrusion portion formed to protrude from the bottom surface of the insulation substrate.

The joining structure may include at least one cavity protrusion portion formed to protrude from the bottom surface of the cavity and at least one insulation substrate recess portion formed to be recessed from the bottom surface of the insulation substrate.

The joining structure may have at least one of a circular, square, or spiral shape.

The light emitting module may further include a conductive pad for electrically connecting the circuit pattern and the pad.

The light emitting module may further include a glass cover disposed over the circuit board.

The light emitting module may further include a barrier disposed on the circuit board to enclose the cavity.

The light emitting module may further include a glass cover disposed over the barrier.

In another embodiment, a light emitting module includes a circuit board having a through hole and including a circuit pattern at a region which does not have the through hole, a heat radiating member disposed beneath the circuit board, an insulation substrate disposed at a region on the heat radiating member corresponding to the through hole while being formed, at an upper portion thereof, with at least one pad, and at least one light emitting device disposed on the pad, wherein a joining structure is disposed between the region on the heat radiating member corresponding to the through hole and a bottom surface of the insulation substrate.

The joining structure may include at least one heat radiating member recess portion formed to be recessed from the region on the heat radiating member corresponding to the through hole.

The light emitting module may further include at least one insulation substrate protrusion portion formed to protrude from the bottom surface of the insulation substrate.

The joining structure may include at least one heat radiating member protrusion portion formed to protrude from the region on the heat radiating member corresponding to the through hole.

The light emitting module may further include at least one insulation substrate recess portion formed to be recessed from the bottom surface of the insulation substrate.

The light emitting module may further include a thermally conductive member disposed between the insulation substrate and the heat radiating member.

The light emitting module may further include a conductive pad for electrically connecting the circuit pattern and the pad.

The light emitting module may further include a glass cover disposed over the circuit board.

The heat radiating member may have, at a lower surface thereof, a plurality of heat radiating fins.

The light emitting module may further include a barrier disposed on the circuit board to enclose the through hole.

In a further embodiment, a light emitting module includes a circuit board including a metal plate, an insulation layer on the metal plate, and a circuit pattern on the insulation layer, an insulation substrate disposed on the circuit board while being formed, at an upper portion thereof, with at least one pad, at least one light emitting device disposed on the pad, and a joining structure disposed between an upper surface of the circuit board and a bottom surface of the insulation substrate, wherein the joining structure comprises a circuit board recess portion formed by removing at least a portion of the insulation layer of the circuit board, and the insulation substrate directly comes into contact with at least a portion of the metal plate through the circuit board recess portion.

The light emitting module may further include a glass cover disposed over the circuit board.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
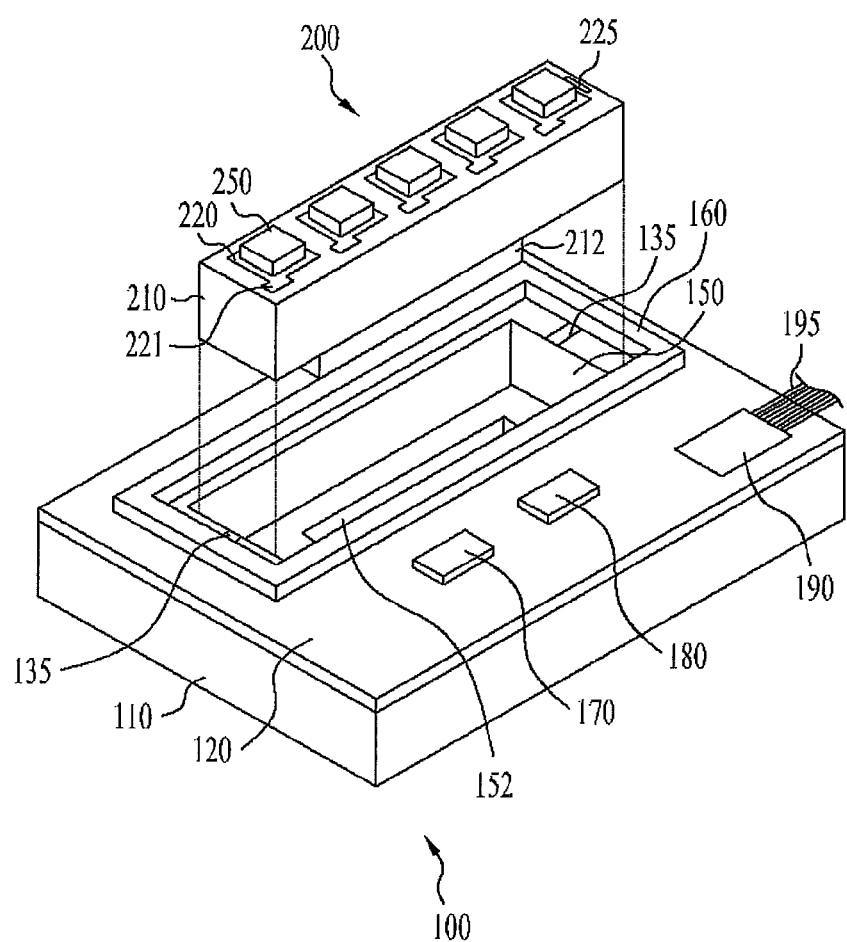
FIG. 1 is an exploded perspective view illustrating a light emitting module according to a first embodiment.

It will be understood that when a layer (film), region, pattern, or structure is referred to as being 'on' or 'under' another layer (film), region, pad, or pattern of a board, it can be directly on/under the layer (film), region, pad, or pattern, and one or more intervening layers may also be present. Also, the reference for 'on' or 'under' of each layer is described according to the drawings.

In the drawings, the thickness or size of each layer may be exaggerated, omitted or schematically illustrated for convenience and clarity of description. In addition, the size of each element does not wholly reflect an actual size thereof.

Hereinafter, a light emitting module according to embodiments will be described with reference to the annexed drawings.

Figure 2:
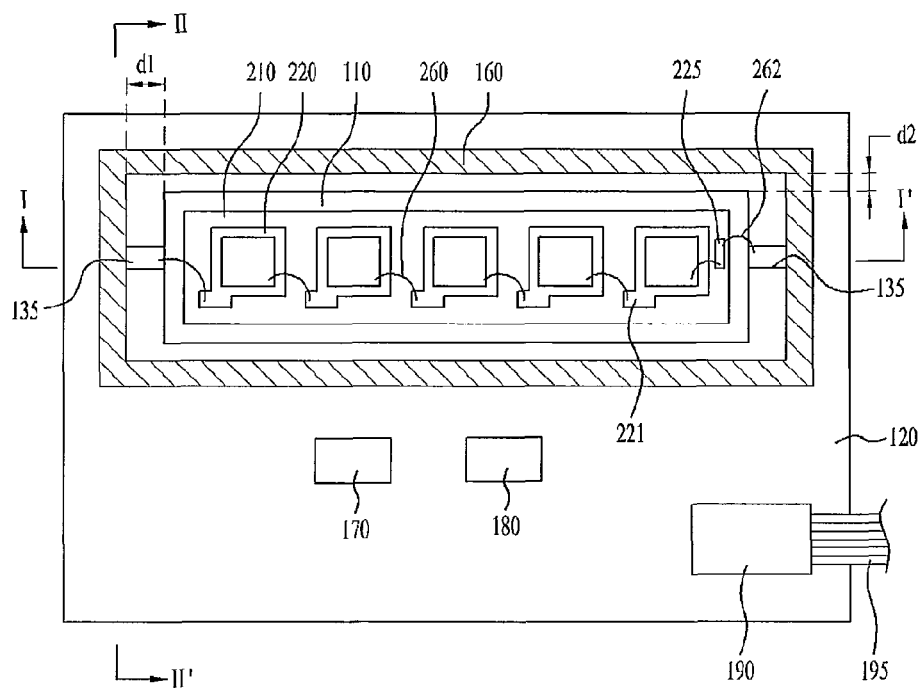
FIG. 2 is a top view illustrating the light emitting module according to the first embodiment.
Figure 3A:
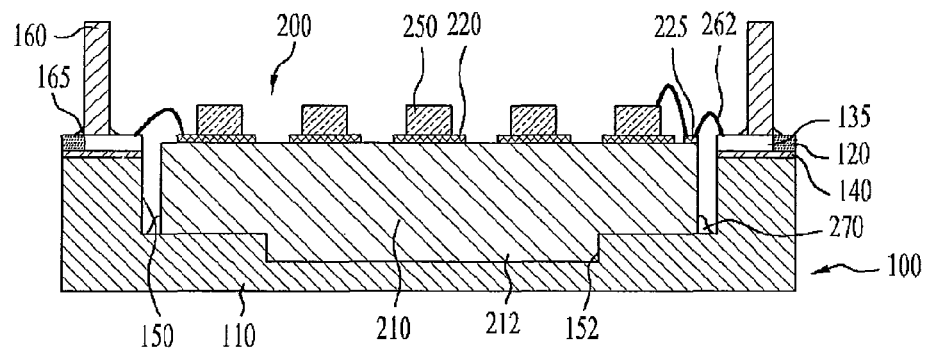
FIGS. 3A to 3C are sectional views cut along line I-I' of the light emitting module shown in FIG. 2.
Figure 3B:
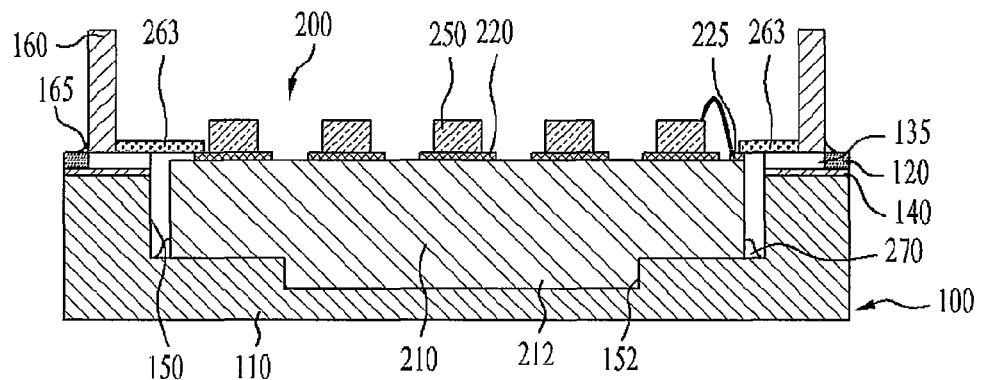
Figure 3C:
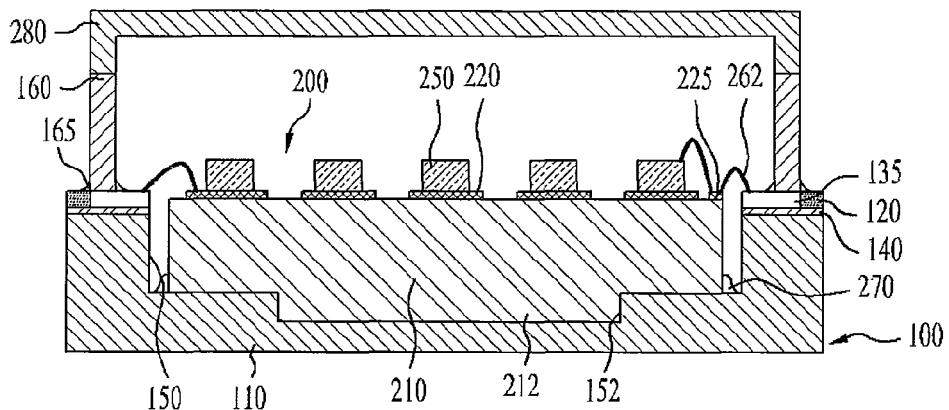
Figure 4:
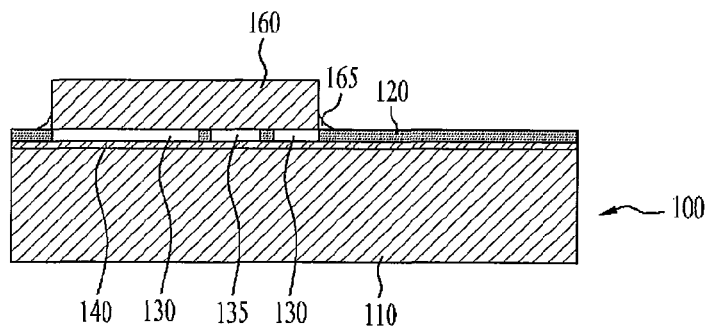
FIG. 4 is a sectional view taken cut line II-II' of the light emitting module shown in FIG. 2.
Figure 5:
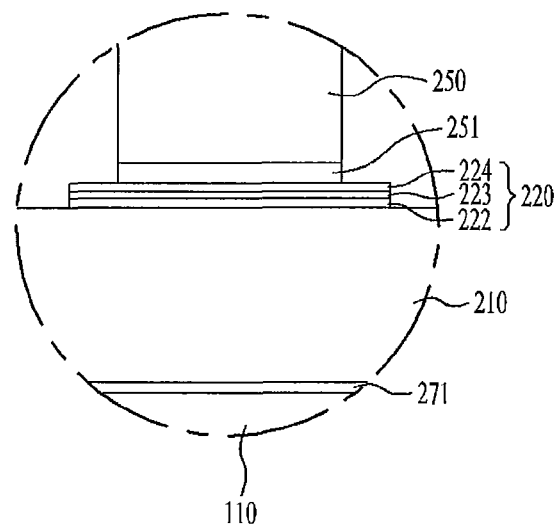
FIG. 5 is a detailed sectional view illustrating one light emitting device included in the light emitting module.

FIG. 1 is an exploded perspective view illustrating a light emitting module according to a first embodiment. FIG. 2 is a top view illustrating the light emitting module according to the first embodiment. FIGS. 3A to 3C are sectional views cut along line I-I' of the light emitting module shown in FIG. 2. FIG. 4 is a sectional view cut along line II-II' of the light emitting module shown in FIG. 2. FIG. 5 is a detailed sectional view illustrating one light emitting device included in the light emitting module.

In these embodiments or other embodiments, the light emitting device may be semiconductor light emitting device, for example, light emitting diode.

Referring to FIGS. 1 to 4, the light emitting module includes a circuit board 100 and a light emitting device package 200 disposed in a cavity 150 of the circuit board 100.

The light emitting module refers to a structure in which the light emitting device package 200 is mounted in the cavity 150 of the circuit board 100. In the light emitting device package 200, a plurality of light emitting devices 250 may be arranged in one or more lines and be connected in series or parallel on an insulation substrate 210. This technical feature may be modified in the technical scope of the embodiments.

The circuit board 100 includes a metal plate 110, an insulation layer 140, a circuit pattern 135, and a guide pattern 130. The circuit pattern 135 is embedded in the insulation layer 140.

The metal plate 110 refers to a heat radiating plate having high thermal conductivity and may be made of an alloy which contains copper (Cu), aluminum (Al), silver (Ag), gold (Au), or the like.

The metal plate 110 has a bar type rectangular parallelepiped shape which is long in a longitudinal direction, and is formed with the cavity 150 having a predetermined depth from an upper surface thereof.

The metal plate 110 may have a cylindrical shape besides the rectangular parallelepiped shape, but is not limited thereto.

The cavity 150 refers to a mounting portion for mounting the light emitting device package 200 and may be formed to have a greater area than the light emitting device package 200.

A joining structure may be disposed between a bottom surface of the cavity 150 and a bottom surface of the insulation substrate 210 of the light emitting device package 200.

The joining structure may include a cavity recess portion 152 formed to be recessed from the bottom surface of the cavity 150 and an insulation substrate protrusion portion 212 formed to protrude from the bottom surface of the insulation substrate 210.

The cavity recess portion 152 is formed at a position corresponding to the insulation substrate protrusion portion 212 so as to be joined with the insulation substrate protrusion portion 212.

The cavity recess portion 152 may be formed at a central region of the bottom surface of the cavity 150 and may have a square or circular shape.

Also, the cavity recess portion 152 may consist of a plurality of cavity recess portions separated from one another or one integrated cavity recess portion.

The metal plate 110 may have a thickness of about 1000 μm or more, and the cavity 150 may have a depth of about 300 μm or more.

The cavity 150 is exposed at and the insulation layer 140 is formed at the upper surface of the metal plate 110.

The insulation layer 140 may consist of a plurality of insulation layers, and a portion of the plural insulation layers may function as an adhesive layer for bonding the metal plate 110 and a metal layer such as a copper foil layer which is the parent of the circuit pattern 135 and guide pattern 130 above the metal plate 110.

The insulation layer 140 may contain an epoxy or polyimide resin material, and a solid component, for example, filler or glass fiber may be distributed therein. Unlike this, the insulation layer 140 may be made of an inorganic substance such as an oxide or nitride.

The guide pattern 130 and circuit pattern 135 may be formed by etching the copper foil layer and made of an alloy containing copper (Cu).

The circuit pattern 135 is disposed on the insulation layer 140 to expose the cavity 150, and a solder resist 120 is formed to expose the guide pattern 130 and the circuit pattern 135.

The solder resist 120 is applied to an entire surface of the circuit board 100 and is colored in a dark color having low light transmittance and reflectivity in order to improve light collecting properties by absorption of scattered light. For example, the solder resist 120 may be black.

Meanwhile, the circuit pattern 135 and the guide pattern 130 are electrically isolated by the solder resist 120, as shown in FIG. 4.

In detail, the guide pattern 130 encloses the cavity 150 and is formed to be spaced apart from the cavity 150 by predetermined distances d1 and d2.

The circuit pattern 135 may be electrically connected to the light emitting device package 200 using a wire 262 bonding manner or a conductive pad 263 bonding manner, and be formed to be exposed in the distances d1 and d2 spaced between the cavity 150 and the guide pattern 130.

In this case, in the distances d1 and d2 spaced between the cavity 150 and the guide pattern 130, the distance d1 of a side formed with the circuit pattern 135 may differ from the distance d2 of a side not formed with the circuit pattern 135.

A barrier 160 is disposed on the circuit board 100 to enclose the cavity 150.

The barrier 160 may be made of an insulative inorganic substance and an impermeable material. For example, the barrier 160 may be made of the impermeable material such as a bulk aluminum oxide and be formed to have a height of about 800 μm. The barrier 160 refers to a structure for collecting light emitted from the light emitting device package 200 and may function as an absorption layer for absorption of scattered light.

Meanwhile, the light emitting device package 200 is attached in the cavity 150 of the circuit board 100.

Hereinafter, the following description will be given of a joining structure between the light emitting device package and the circuit board with reference to FIGS. 3A to 3C and the light emitting device package with reference to FIG. 5 in detail.

The light emitting device package 200 includes an insulation substrate 210, a plurality of pads 220 formed on the insulation substrate 210, and a plurality of light emitting devices 250 disposed on the respective pads 220.

The insulation substrate 210 has a rectangular parallelepiped shape which is the same size as or has a sectional area smaller than the bottom surface of the cavity 150 so as to be mounted in the cavity 150.

The insulation substrate 210 may be a nitride board, for example, an aluminum nitride board having high thermal conductivity. The insulation substrate 210 may have thermal conductivity of 170 Kcal/m·h·° C. or more. The insulation substrate 210 may have a thickness of 300 μm or more, or 350 μm or more. The insulation substrate 210 is thicker than the depth of the cavity 150, thereby being able to be exposed outside the cavity 150.

The insulation substrate 210 may include the insulation substrate protrusion portion 212 which protrudes toward the bottom surface of the cavity 150.

The insulation substrate protrusion portion 212 may have a shape corresponding to the cavity recess portion 152 of the cavity 150 and may have a circular or square shape in section.

The insulation substrate protrusion portion 212 may consist of a plurality of protrusion portions separated from one another or one integrated protrusion portion.

As shown in FIG. 5, the insulation substrate 210 is disposed on the cavity 150 by an adhesive paste 271, which is applied to the bottom surface of the cavity 150 and has high thermal conductivity. The adhesive paste 271 may be a conductive paste containing a AuSn material.

The adhesive paste 271 is thinly distributed beneath the bottom surface of the insulation substrate 210 by heat and pressure, and a fillet 270 is formed to enclose a portion of sides of the insulation substrate 210, such that the insulation substrate 210 is supported.

Thus, when the insulation substrate 210 is disposed on the bottom surface of the cavity 150 by the adhesive paste 271, the adhesive paste 271 is also applied to an interface in which the insulation substrate protrusion portion 212 is fitted into the cavity recess portion 152, thereby enlarging an adhesive area and improving adhesive and heat radiating properties.

Meanwhile, the plural pads 220 are formed on an upper surface of the insulation substrate 210.

The plural pads 220 may be arranged to form a line along an array of the light emitting devices 250.

The pads 220 are the same in number as the light emitting devices 250. As shown in FIGS. 1 to 4, when the five light emitting devices 250 arranged in one line are formed at the light emitting device package 200, the pads 220 may consist of five pads arranged in a line.

Each of the pads 220 includes an electrode region at which the corresponding light emitting device 250 is attached and a connection region 221 for wire bonding to a neighboring one of the light emitting devices 250 or the circuit pattern 135 of the circuit board 100.

The electrode region may have a square shape corresponding to an area of each light emitting device 250, and the connection region 221 may extend from the electrode region and protrude toward a neighboring one of the pads 220.

Although FIGS. 1 and 2 shows that the connection region 221 has the square shape, the connection region 221 is not limited thereto and may be formed in various shapes.

Each light emitting device 250 is disposed on the electrode region of the corresponding pad 220.

The light emitting devices 250 refer to vertical type light emitting diodes (LEDs). Each light emitting device 250 is attached, at one end thereof, to the corresponding pad 220 while being bonded, at the other end thereof, to the connection region 221 of the neighboring pad 220 through a wire 260, thereby being connected in series.

Referring to FIGS. 2 and 3A, when the plural light emitting devices 250 are connected in series, the connection region 221 of the first row of the pads 220 is connected to the circuit pattern 135 of the circuit board 100 adjacent to the connection region 221 through a wire 262.

In this case, the light emitting device package 200 includes, at an upper surface thereof, a pad island 225, which is adjacent to the last row of the pads 220 attaching the light emitting devices 250 and has only the connection region 221.

The pad island 225 may be connected to the light emitting device 250 of the neighboring pad 220 through the wire 260, and be connected to the circuit pattern 135 of the circuit board 100 adjacent to the pad island 225 through another wire 262.

In addition, in the upper surface of the light emitting device package 200, the connection region 221 of the first row of the pads 220 may be connected to the circuit pattern 135 of the circuit board 100 through a conductive pad 263, whereas the pad island 225, which is adjacent to the last row of the pads 220 and has only the connection region 221, may also be connected to the circuit pattern 135 of the circuit board 100 through another conductive pad 263, as shown in FIG. 3B.

That is, the pad 220 or pad island 225 is electrically connected to the circuit pattern 135 of the circuit board 100 through the conductive pad 263 instead of the wire bonding manner, thereby enabling improvement in durability and reliability of the light emitting module.

Furthermore, referring to FIG. 3C, a glass cover 280 may be disposed on the circuit board 100.

The glass cover 280 may serve to physically protect the light emitting devices 250 included at the light emitting device package 200 and the wires 262.

The glass cover 280 may be directly disposed on the circuit board 100 or may also be disposed on the barrier 160 as shown in FIG. 3C. That is, the glass cover 280 may also be disposed between the circuit board 100 and the barrier 160.

As shown in FIG. 5, the pads 220 and the pad island 225 are formed in a plurality of metal layers 222, 223, and 224.

The pads 220 and the pad island 225 may have a laminated structure of first, second, and third metal layers 222, 223, and 224, and each metal layer 222, 223, or 224 may be made of an alloy containing titanium (Ti), nickel (Ni), gold (Au), or platinum (Pt).

For example, the first metal layer 222 may be made of the alloy containing titanium (Ti), the second metal layer 223 may be made of the alloy containing nickel, and the third metal layer 224 may be made of the alloy containing gold (Au). The total sum of thickness of the first to third metal layers 222, 223, and 224 may satisfy a range of 0.45 μm to 0.75 μm.

The first to third metal layers 222, 223, and 224 may be formed using a thin film deposition manner, such as sputtering, ion beam deposition, electron beam deposition, or the like. The first to third metal layers 222, 223, and 224 are formed as a thin film to satisfy a range of several μm, such that fine patterns may be realized in the light emitting device package 200.

Each light emitting device 250 is disposed on the electrode region of the corresponding pad 220. The light emitting device 250 may include, at a lower portion thereof, a conductive adhesive layer 251, and the conductive adhesive layer 251 may be a conductive paste containing a AuSn material. The conductive adhesive layer 251 may have a thickness of 30 μm or below or a thickness of 25 μm or below.

The light emitting device 250 may selectively include a semiconductor light emitting device which is fabricated using a Group III/V compound semiconductor, for example, AlInGaN, InGaN, GaN, GaAs, InGaP, AlInGaP, InP, InGaAs, or the like.

Also, each light emitting device 250 may consist of a blue, yellow, green, red, ultraviolet (UV), amber, blue-green LED chip, or the like, but may be a blue LED chip in the case of a head lamp for a vehicle.

Figure 6:
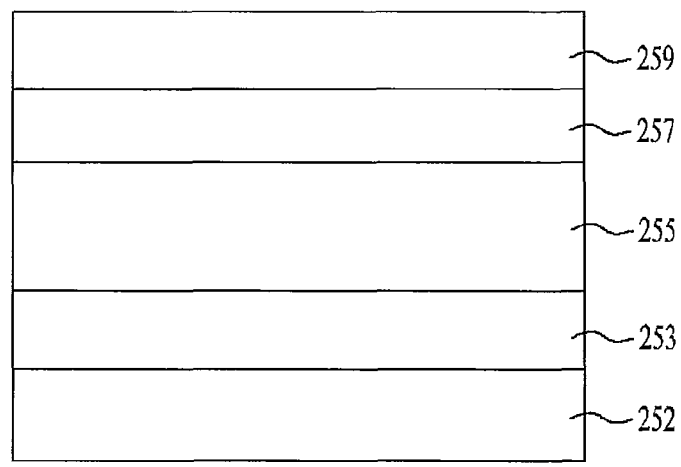
FIG. 6 is a sectional view illustrating the light emitting device according to the illustrated embodiment.

FIG. 6 is a lateral sectional view illustrating the light emitting device according to the illustrated embodiment.

Referring to FIG. 6, each light emitting device 250 includes a conductive support board 252, a bonding layer 253, a second conductive type semiconductor layer 255, an active layer 257, and a first conductive type semiconductor layer 259.

The conductive support board 252 may be formed as a metallic or electrically conductive semiconductor board.

A Group III-V nitride semiconductor layer is formed on the conductive support board 252. Although a semiconductor growth equipment may be formed by electron beam deposition, physical vapor deposition (PVD), chemical vapor deposition (CVD), plasma laser deposition (PLD), dual-type thermal evaporation, sputtering, metal organic chemical vapor deposition (NOCVD), or the like, the present disclosure is not limited thereto.

The bonding layer 253 may be formed on the conductive support board 252. The bonding layer 253 serves to bond the conductive support board 252 and the nitride semiconductor layer. In addition, the conductive support board 252 may also be formed in a plating manner instead of the bonding manner. In this case, the bonding layer 253 may also not be formed.

The second conductive type semiconductor layer 255 is formed on the bonding layer 253, and comes into contact with the electrode region of each pad 220 to be electrically connected with the electrode region.

The second conductive type semiconductor layer 255 may be made of a Group III-V compound semiconductor, for example, at least one of GaN, InN, AlN, InGaN, AlGaN, InAlGaN, and AlInN. The second conductive type semiconductor layer 255 may be doped with a second conductive type dopant. When the second conductive type semiconductor layer 255 is a p-type semiconductor, the second conductive type dopant refers to a p-type dopant. The p-type dopant may include Mg, Zn, Ca, Sr, Ba, or the like.

The second conductive type semiconductor layer 255 may be formed as a p-type GaN layer of a predetermined thickness through supply of gas including the p-type dopant, such as NH3, TMGa (or TEGa), and Mg.

The second conductive type semiconductor layer 255 includes a current spreading structure at a predetermined region thereof. The current spreading structure includes semiconductor layers having a current spreading speed in a horizontal direction higher than a current spreading speed in a vertical direction.

The current spreading structure may include, for example, semiconductor layers having differences in dopant concentration or conductivity.

The second conductive type semiconductor layer 255 may supply carriers which are uniformly distributed and diffused in another layer thereover, for example, the active layer 257.

The active layer 257 is formed on the second conductive type semiconductor layer 255. The active layer 257 may have a single quantum well structure or a multi quantum well (MQW) structure. One period of the active layer 257 may selectively include a period of InGaN/GaN, a period of AlGaN/InGaN, a period of InGaN/InGaN, or a period of AlGaN/GaN.

A second conductive type clad layer (not shown) may be formed between the second conductive type semiconductor layer 255 and the active layer 257. The second conductive type clad layer may be made of a p-type GaN semiconductor. The second conductive type clad layer may be made of a material having a band gap greater than an energy band gap of a well layer.

The first conductive type semiconductor layer 259 is formed on the active layer 257. The first conductive type semiconductor layer 259 may be implemented as an n-type semiconductor layer doped with a first conductive type dopant. The n-type semiconductor layer may be made of any one of compound semiconductors such as GaN, InN, AlN, InGaN, AlGaN, InAlGaN or AlInN, etc. When the first conductive type semiconductor layer 259 is the n-type semiconductor layer, the first conductive type dopant refers to an n-type dopant. The n-type dopant may include Si, Ge, Sn, Se, Te, or the like.

The first conductive type semiconductor layer 259 may be formed as an n-type GaN layer of a predetermined thickness through supply of gas including the n-type dopant, such as NH3, TMGa (or TEGa), and Si.

Also, the second conductive type semiconductor layer 255 may be implemented as the p-type semiconductor layer, whereas the first conductive type semiconductor layer 259 may be implemented as the n-type semiconductor layer. A light emitting structure may be implemented as any one of an n-p junction structure, a p-n junction structure, an n-p-n junction structure, and a p-n-p junction structure. Hereinafter, the following description will be given of the case in which the highest layer of the semiconductor layer is the first conductive type semiconductor layer by way of example for description of present embodiment.

A first electrode and/or an electrode layer (not shown) may be formed on the first conductive type semiconductor layer 259. The electrode layer may be formed as a light transmitting layer of an oxide or nitride made of a material, for example, selected from the group consisting of indium tin oxide (ITO), indium tin oxide nitride (ITON), indium zinc oxide (IZO), indium zinc oxide nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), iridium oxide (IrOx), ruthenium oxide (RuOx), or nickel oxide (NiO). The electrode layer may function as a current spreading layer capable of spreading currents.

Although a plurality of vertical type light emitting devices 250 connected in series in the light emitting device package 200 is illustrated in FIGS. 1 to 6, the vertical type light emitting devices 250 may be connected in parallel and horizontal type light emitting devices 250 may be connected in series or parallel.

Thus, in the light emitting module of FIGS. 1 to 6, the insulation substrate 210 of the light emitting device package 200 is used as the nitride, and the insulation substrate 210 and the metal plate 110 of the circuit board 100 are directly bonded through the adhesive paste 271 having high thermal conductivity to attain heat radiating properties. Consequently, the pads 220 of the light emitting device package 200 may be formed as metal thin films using sputtering or the like without being formed by patterning thick copper metals, thereby enabling formation of the fine patterns.

Meanwhile, again referring to FIGS. 1 and 2, a Zener diode 170 and a temperature sensor 180 are disposed on the solder resist 120 at the upper surface of the metal plate 110 of the circuit board 100.

As shown in FIG. 1, the Zener diode 170 and the temperature sensor 180 may be disposed at an outer position of the barrier 160.

The temperature sensor 180 may be a thermistor having a variable resistance in which a resistance value is changed depending on temperature, or a negative temperature coefficient (NTC) in which a specific resistance is diminished depending on an increase in temperature.

A connector 190 is connected, at one end thereof, to a plurality of electric wires 195 while being connected, at the other end thereof, to the circuit pattern of the circuit board 100, such that a voltage is applied to the Zener diode 170, the temperature sensor 180, and the light emitting device package 200, and the current output from the temperature sensor 180 flows outward.

An outdoor control unit (not shown) detects heat generated from the light emitting devices 250 according to current values output from the temperature sensor 180, enabling control of voltages applied to the light emitting devices 250.

Hereinafter, the following description will be given of various embodiments for a joining structure between a light emitting device package 200 and a circuit board 100. No description with respect to configurations similar to the above-mentioned embodiment will be given.

Figure 7:
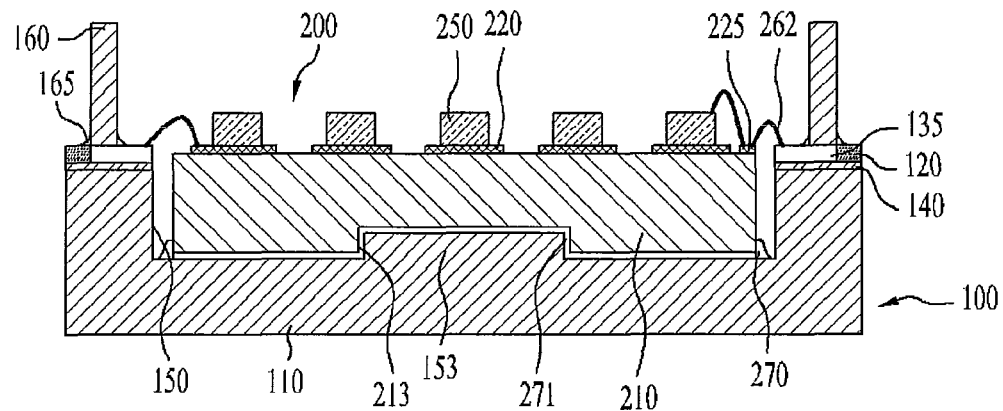
FIG. 7 is a sectional view illustrating a light emitting module according to a second embodiment.

FIG. 7 is a sectional view illustrating a light emitting module according to a second embodiment.

Referring to FIG. 7, a circuit board 100 of the light emitting module is similar to the circuit board 100 of the first embodiment, and a light emitting device package 200 is similar to the light emitting device package 200 of the first embodiment.

The light emitting device package 200 includes an insulation substrate 210, a plurality of pads 220 formed on the insulation substrate 210, and a plurality of light emitting devices 250 disposed on the respective pads 220.

The circuit board 100 includes a metal plate 110, an insulation layer 140, a guide pattern 130, a circuit pattern 135, and a solder resist 120 for covering the insulation layer 140.

The metal plate 110 is formed with a cavity 150 having a predetermined depth from an upper surface thereof.

The cavity 150 refers to a mounting portion for mounting the light emitting device package 200 and may be formed to have a greater area than the light emitting device package 200, such that an inner side surface of the cavity 150 may be spaced apart from the light emitting device package 200.

The cavity 150 has a cavity protrusion portion 153 which protrudes from a bottom surface thereof toward the light emitting device package 200, whereas the insulation substrate 210 of the light emitting device package 200 has an insulation substrate recess portion 213 formed to be recessed from a bottom surface thereof.

The cavity protrusion portion 153 is disposed at a position corresponding to the insulation substrate recess portion 213 so as to be joined with the insulation substrate recess portion 213 of the light emitting device package 200.

The cavity protrusion portion 153 may be formed at a central region of the bottom surface of the cavity 150 and may have a square or circular shape.

The cavity protrusion portion 153 may consist of a plurality of protrusion portions separated from one another or one integrated protrusion portion.

On the other hand, the insulation substrate recess portion 213 may consist of a plurality of recess portions separated from one another or one integrated recess portion.

The solder resist 120 is applied to an entire surface of the circuit board 100 and is colored in a dark color having low light transmittance and reflectivity in order to improve light collecting properties by absorption of scattered light.

Figure 8:
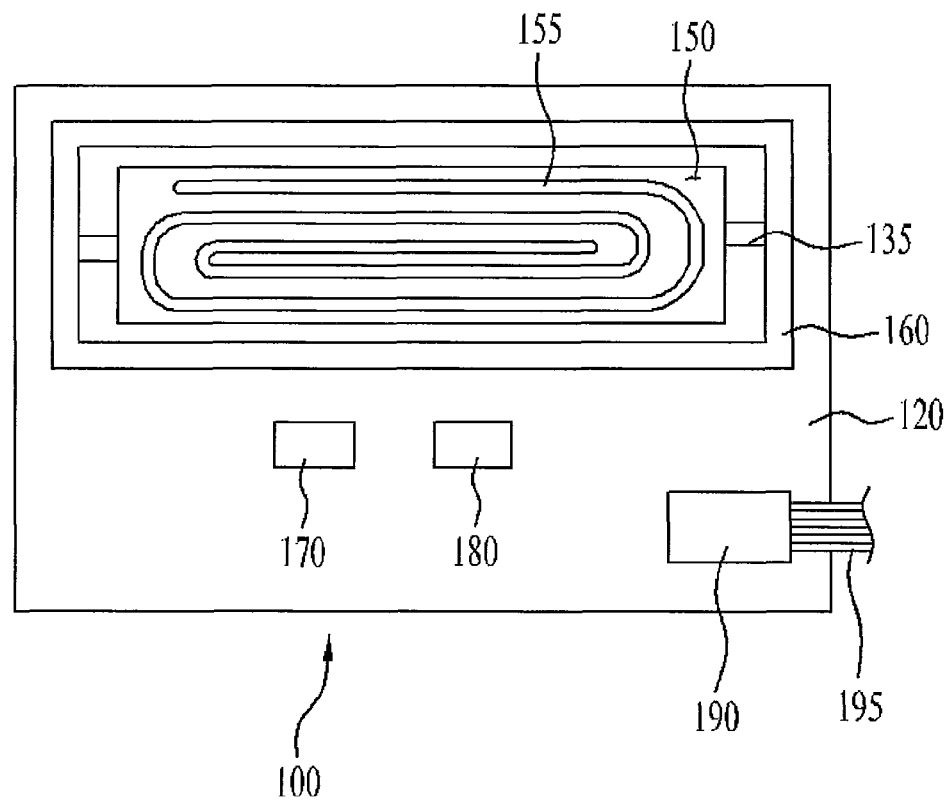
FIG. 8 is a top view illustrating a circuit board according to a third embodiment.

FIG. 8 is a top view illustrating a circuit board according to a third embodiment.

Referring to FIG. 8, a circuit board 100 is similar to the circuit board 100 of the first embodiment, and a light emitting device package 200 is similar to the light emitting device package 200 of the first embodiment.

That is, the circuit board 100 includes a metal plate 110, an insulation layer 140, a guide pattern 130, a circuit pattern 135, and a solder resist 120 for covering the insulation layer 140.

The metal plate 110 is formed with a cavity 150 having a predetermined depth from an upper surface thereof.

The cavity 150 may be formed, at a bottom surface thereof, with a cavity recess portion 155, which may have, for example, a spiral shape.

The insulation substrate 210 of the light emitting device package 200 may be formed with an insulation substrate protrusion portion corresponding to the shape of the cavity recess portion 155.

The cavity recess portion 155 is joined to the insulation substrate protrusion portion, thereby enabling enlargement of a joining area.

Although FIG. 8 shows that the cavity recess portion 155 having the spiral shape is formed at the bottom surface of the cavity 150, this is illustrated by way of example. Accordingly, the bottom surface of the cavity 150 may be formed with a cavity protrusion portion having a spiral shape, whereas the bottom surface of the insulation substrate 210 may be formed with an insulation substrate recess portion so as to correspond to the cavity protrusion portion.

Figure 9:
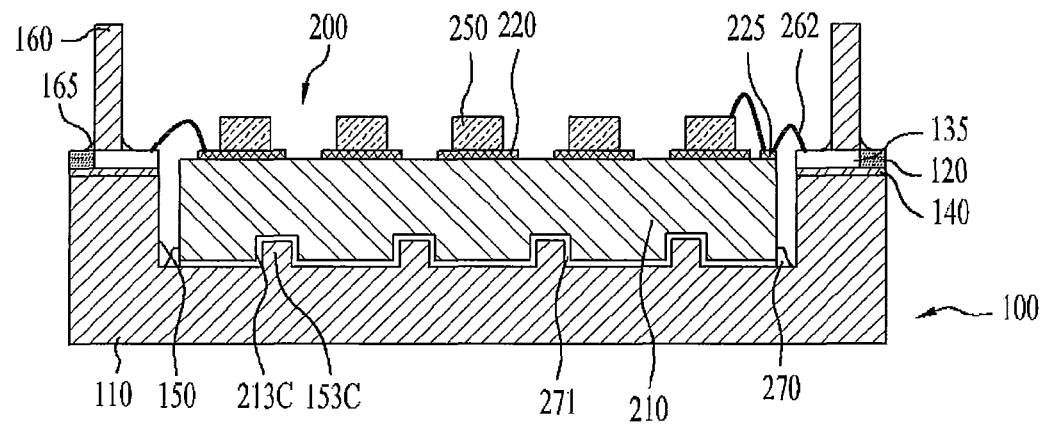
FIG. 9 is a sectional view illustrating a light emitting module according to a fourth embodiment.

FIG. 9 is a sectional view illustrating a light emitting module according to a fourth embodiment.

Referring to FIG. 9, a circuit board 100 is similar to the circuit board 100 of the first embodiment, and a light emitting device package 200 is similar to the light emitting device package 200 of the first embodiment.

In the light emitting device package 200 as the first embodiment, a plurality of light emitting devices 250 are mounted on an insulation substrate 210, and the insulation substrate 210 is formed, at a bottom surface thereof, with a plurality of insulation substrate recess portions 213C.

The plural insulation substrate recess portions 213C may be separated from one another, and may have a shape equal to or different from one another.

Meanwhile, the circuit board 100 includes a metal plate 110, an insulation layer 140, a guide pattern 130, a circuit pattern 135, and a solder resist 120 for covering the insulation layer 140.

The metal plate 110 is formed with a cavity 150 having a predetermined depth from an upper surface thereof.

The cavity 150 is formed, at a bottom surface thereof, with a plurality of cavity protrusion portions 153C.

The plural cavity protrusion portions 153C may be separated from one another, and may have a shape equal to or different from one another.

The cavity protrusion portions 153C have the shape corresponding to the insulation substrate recess portions 213C, and the cavity protrusion portions 153C are respectively joined to the insulation substrate recess portions 213C, thereby enabling enlargement of a joining area.

Figure 10:
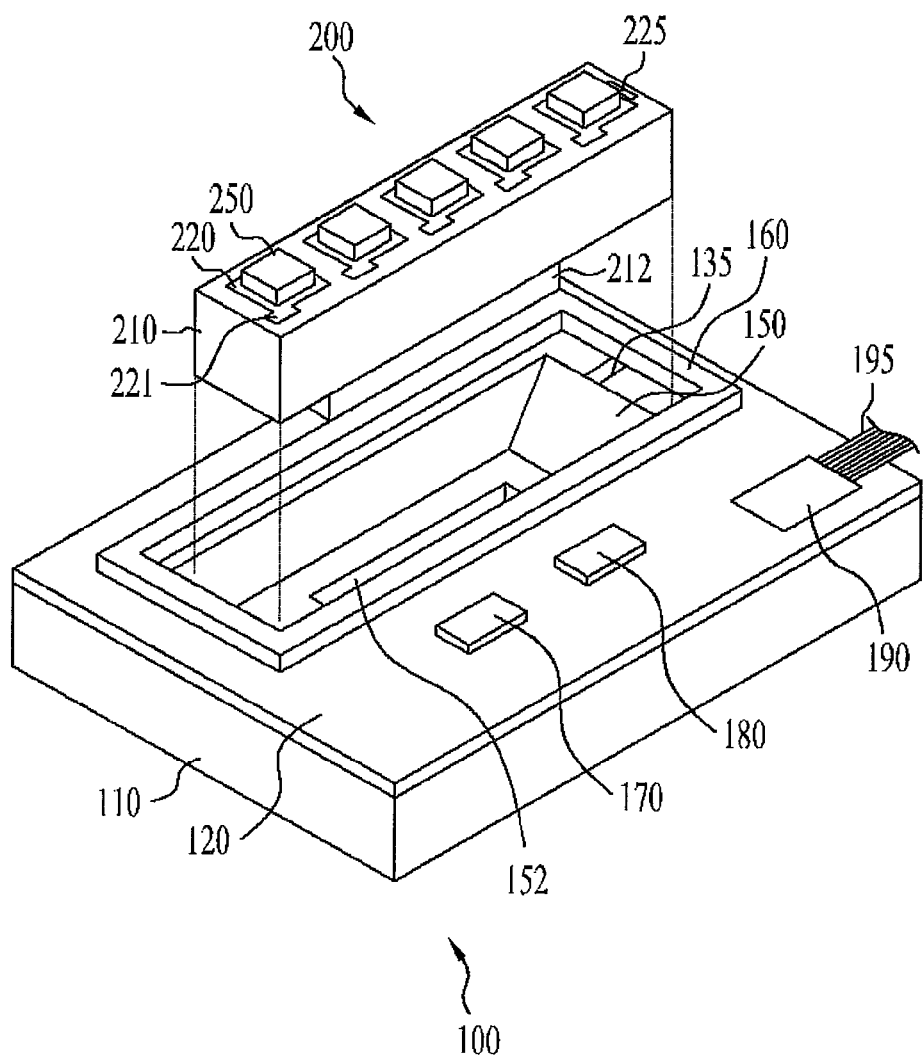
FIG. 10 is an exploded perspective view illustrating a light emitting module according to a fifth embodiment.

FIG. 10 is an exploded perspective view illustrating a light emitting module according to a fifth embodiment.

Referring to FIG. 10, a circuit board 100 is similar to the circuit board 100 of the first embodiment, and a light emitting device package 200 is similar to the light emitting device package 200 of the first embodiment.

That is, the circuit board 100 includes a metal plate 110, an insulation layer 140, a guide pattern 130, a circuit pattern 135, and a solder resist 120 for covering the insulation layer 140.

The metal plate 110 is formed with a cavity 150 having a predetermined depth from an upper surface thereof.

The cavity 150 is slanted, at a side surface thereof, relative to a bottom surface thereof, and the bottom surface of the cavity 150 has an area equal to or larger than the light emitting device package 200.

The bottom surface of the cavity 150 is formed with a cavity recess portion 152.

As shown in FIG. 10, since the side surface of the cavity 150 is slanted relative to the bottom surface thereof, the light emitting device package 200 may be accurately seated in the bottom surface of the cavity 150 along the side surface thereof during seating of the light emitting device package 200, thereby resolving misalignment.

Figure 11:
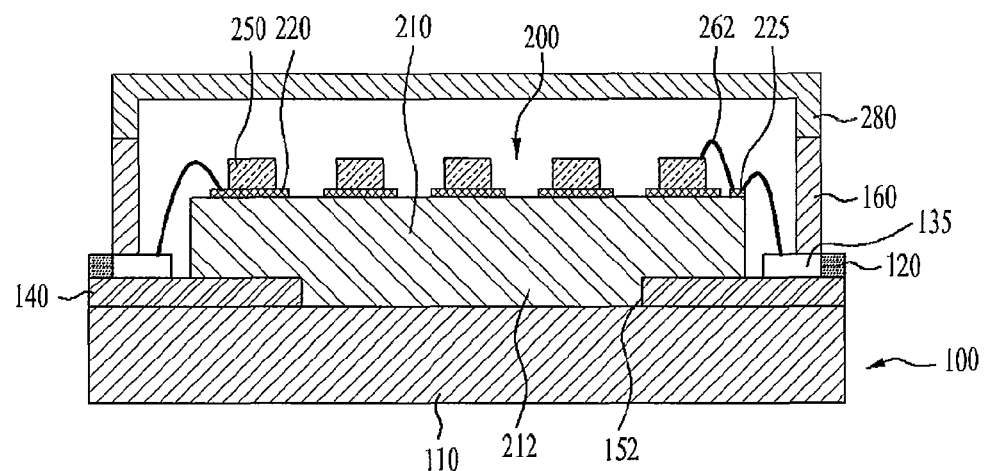
FIG. 11 is a sectional view illustrating a light emitting module according to a sixth embodiment.

FIG. 11 is a sectional view illustrating a light emitting module according to a sixth embodiment.

Referring to FIG. 11, the light emitting module includes a circuit board 100 and a light emitting device package 200 at an upper surface of the circuit board 100.

The light emitting module refers to a structure in which the light emitting device package 200 is mounted on the circuit board 100, and the light emitting device package 200 is similar to the configuration of the first embodiment illustrated in FIG. 1.

The circuit board 100 includes a metal plate 110, an insulation layer 140, and a circuit pattern 135.

The metal plate 110 refers to a heat radiating plate having high thermal conductivity and may be made of an alloy which contains copper (Cu), aluminum (Al), silver (Ag), gold (Au), or the like. The metal plate 110 may also be made of the alloy which contains copper (Cu).

The insulation layer 140 is formed at an upper surface of the metal plate 110.

The insulation layer 140 may be an oxide layer formed by anodizing a surface of the metal plate 110. Unlike this, the insulation layer 140 may be formed by attaching a separate insulation layer.

The circuit pattern 135 is embedded in the insulation layer 140.

Also, a solder resist 120 is formed to open a region at which the light emitting device package 200 is mounted.

The circuit board 100 has a circuit board recess portion 152 formed by removing at least a portion of the insulation layer 140, such that the insulation layer 140 may directly come into contact with the metal plate 110 through the circuit board recess portion 152.

The circuit board recess portion 152 may be formed by etching only the insulation layer 140 as shown in FIG. 11, or be formed by etching a portion of the metal plate 110 as well.

The insulation layer 140 may be formed, at a bottom surface thereof, with an insulation layer protrusion portion 212 corresponding to the circuit board recess portion 152.

A barrier 160 is formed to enclose the region at which the light emitting device package 200 is mounted.

In accordance with the present embodiment, a glass cover 280 may be disposed over the circuit board 100, and the glass cover 280, for example, may also be disposed on the barrier 160.

The light emitting device package 200 is disposed on a light emitting device mounting region of the circuit board 100. Since another configuration is similar to the first embodiment, no description will be given thereof in the present embodiment.

Figure 12A:
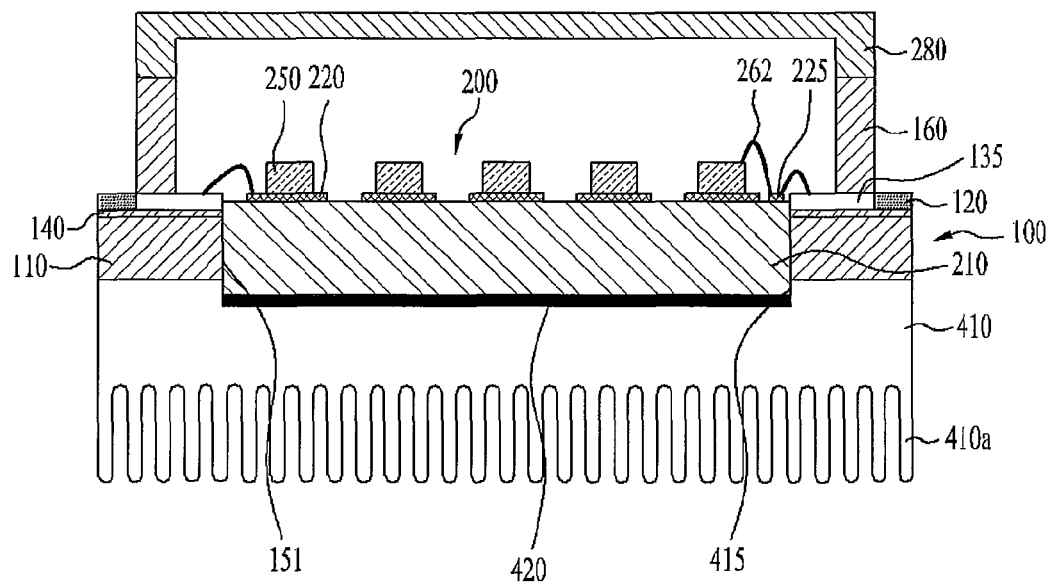
FIGS. 12A and 12B are sectional views illustrating a light emitting module according to a seventh embodiment.
Figure 12B:
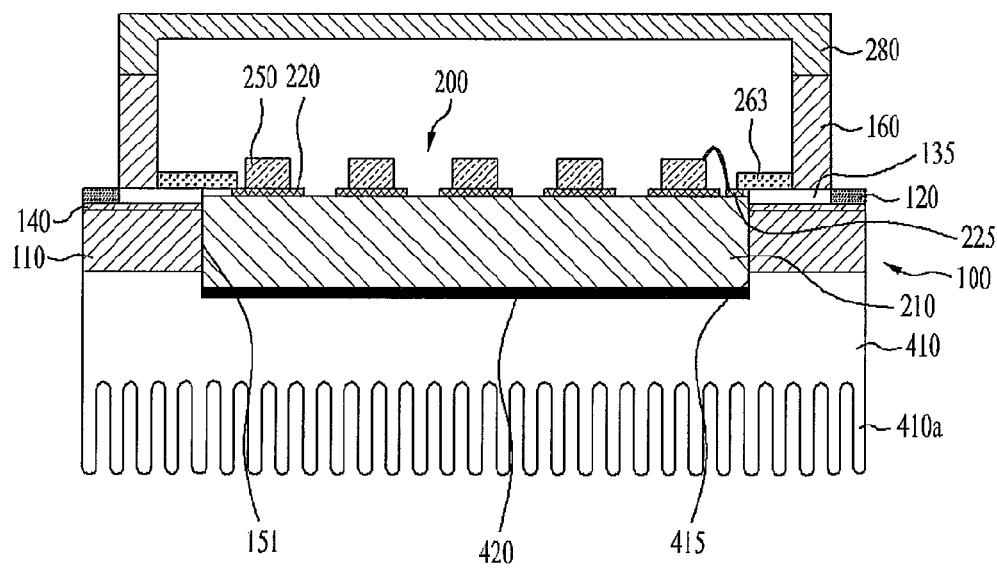

FIGS. 12A and 12B are sectional views illustrating a light emitting module according to a seventh embodiment.

Referring to FIGS. 12A and 12B, the light emitting module includes a circuit board 100 and a light emitting device package 200 disposed at the circuit board 100.

The light emitting module refers to a structure in which the light emitting device package 200 is mounted on the circuit board 100, and the light emitting device package 200 is similar to the configuration of the first embodiment illustrated in FIG. 1.

The circuit board 100 includes a metal plate 110 having a through hole 151, an insulation layer 140, and a circuit pattern 135.

The circuit pattern 135 is embedded in the insulation layer 140.

The through hole 151 of the circuit board 100 may be formed using a Computer Numerical Control (CNC) manner, or be formed, for example, by a machining process using a drill or by a etching process. However, the disclosure is not limited thereto.

The insulation layer 140 and the circuit pattern 135 may be disposed at a region on the metal plate 110 at which the through hole 151 is not formed so as to expose the through hole 151.

The light emitting device package 200 is disposed in the through hole 151 formed at the circuit board 100.

A heat radiating member 410 may be disposed beneath the circuit board 100 and the insulation substrate 210.

The heat radiating member 410 may be made of a material having superior thermal conductivity, and may absorb heat radiated from light emitting devices 250 of the light emitting device package 200 so as to outwardly radiate the heat.

The insulation substrate 210 is disposed at a region on the heat radiating member 410, which corresponds to the through hole 151 of the circuit board 100.

In the present embodiment, the light emitting device package 200 is directly disposed on the heat radiating member 410 instead of the circuit board 100. Consequently, heat transfer distance is reduced as much as a thickness of the circuit board 100, thereby enabling improvement in heat radiating efficiency of the light emitting module.

That is, the radiated heat is in proportional to a heat radiating area A and inverse proportional to a heat transfer distance L, as illustrated in Equation 1 below. Accordingly, the heat transfer distance L is reduced in such a manner that the through hole 151 is formed at the circuit board 100 and the light emitting device package 200 is directly disposed at the region on the heat radiating member 410 corresponding to the through hole 151. As a result, heat radiating characteristics of the light emitting module may be improved.

$$Rth = \frac{L}{k*A}$$ [Equation 1]

where, "$R_{th}$" represents the heat resistance value, represents the thickness of a surface perpendicular to the heat flow, "k" represents thermal conductivity, and "A" represents the area of the surface perpendicular to the heat flow.

A joining structure is disposed between a bottom surface of the insulation substrate 210 and the region on the heat radiating member 410 at which the insulation substrate 210 is disposed. The joining structure includes a heat radiating member recess portion 415 formed to be recessed in the heat radiating member 410.

The insulation substrate 210 may be inserted into and joined with the heat radiating member recess portion 415. In this case, the insulation substrate 210 may be disposed to come into contact with an inner side surface of the through hole 151 without being disposed to be spaced apart from the through hole 151, in order to more securely join the heat radiating member 410 and the insulation substrate 210.

The heat radiating member 410 may be formed, at a lower surface thereof, with a plurality of heat radiating fins 410a.

The heat radiating fins 410a serves to enlarge a contact area between the heat radiating member 410 and outdoor air, thereby enabling an increase in heat radiating efficiency.

A thermally conductive member 420 may be disposed between the insulation substrate 210 and the heat radiating member 410.

The thermally conductive member 420 may be made of a material having superior thermal conductivity. The thermally conductive member 420 allows heat to be transferred from the insulation substrate 210 to the heat radiating member 410 by tight contact between the insulation substrate 210 and the heat radiating member 410.

Also, a barrier 160 may be disposed on the circuit board 100 to enclose the through hole 151.

A glass cover 280 may be disposed over the circuit board 100, and the glass cover 280, for example, may also be disposed on the barrier 160.

Referring to FIG. 12A, the circuit pattern 135 of the circuit board 100 may be electrically connected to corresponding one of pads 220 and a pad island 225 through wires 262 on the insulation substrate 210.

On the other hand, referring to FIG. 123, the circuit pattern 135 of the circuit board 100 may also be electrically connected to a corresponding one of the pads 220 and the pad island 225 through conductive pads 263 on the insulation substrate 210. This electric connection is achieved through the conductive pads 263 instead of a wire bonding manner, thereby enabling improvement in durability and reliability of the light emitting module.

Figure 13:
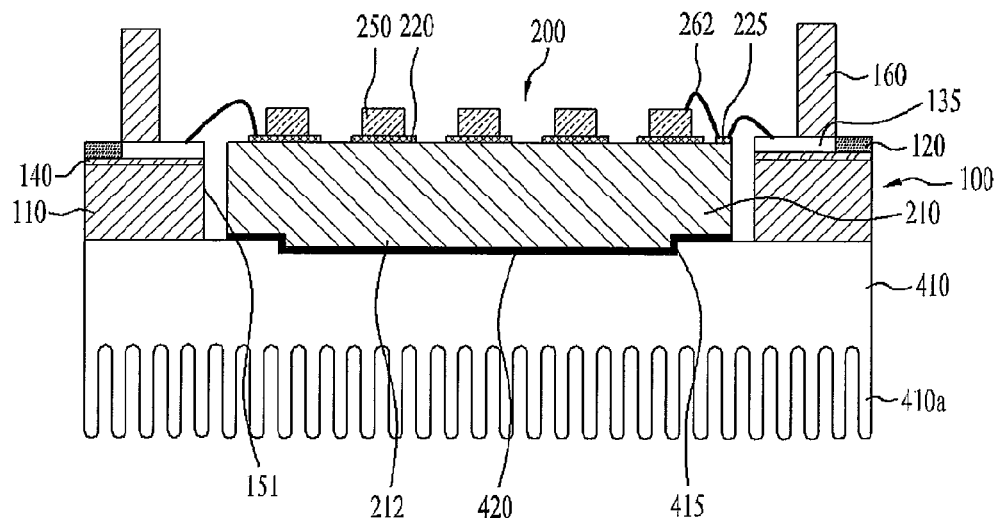
FIG. 13 is a sectional view illustrating a light emitting module according to an eighth embodiment.

FIG. 13 is a sectional view illustrating a light emitting module according to an eighth embodiment.

Referring to FIG. 13, the light emitting module includes a circuit board 100 and a light emitting device package 200 disposed at the circuit board 100.

The light emitting module refers to a structure in which the light emitting device package 200 is mounted on the circuit board 100, and the light emitting device package 200 is similar to the configuration of the first embodiment illustrated in FIG. 1.

The circuit board 100 includes a metal plate 110 having a through hole 151, an insulation layer 140, and a circuit pattern 135.

A heat radiating member 410 is disposed beneath the circuit board 100 and the insulation substrate 210.

The insulation substrate 210 is disposed at a region on the heat radiating member 410, which corresponds to the through hole 151 of the circuit board 100.

A joining structure is disposed between a bottom surface of the insulation substrate 210 and the region on the heat radiating member 410 at which the insulation substrate 210 is disposed.

The joining structure includes a heat radiating member recess portion 415 formed to be recessed in the heat radiating member 410 and an insulation substrate protrusion portion 212 formed to protrude from the bottom surface of the insulation substrate 210.

The heat radiating member recess portion 415 is formed at a position corresponding to the insulation substrate protrusion portion 212, and the heat radiating member recess portion 415 is joined to the insulation substrate protrusion portion 212, thereby enabling enlargement of a contact area and improvement in heat radiating efficiency of the light emitting module.

The insulation substrate protrusion portion 212 may consist of a plurality of protrusion portions separated from one another or one integrated protrusion portion.

On the other hand, the heat radiating member recess portion 415 may also consist of a plurality of recess portions separated from one another or one integrated recess portion.

Figure 14:
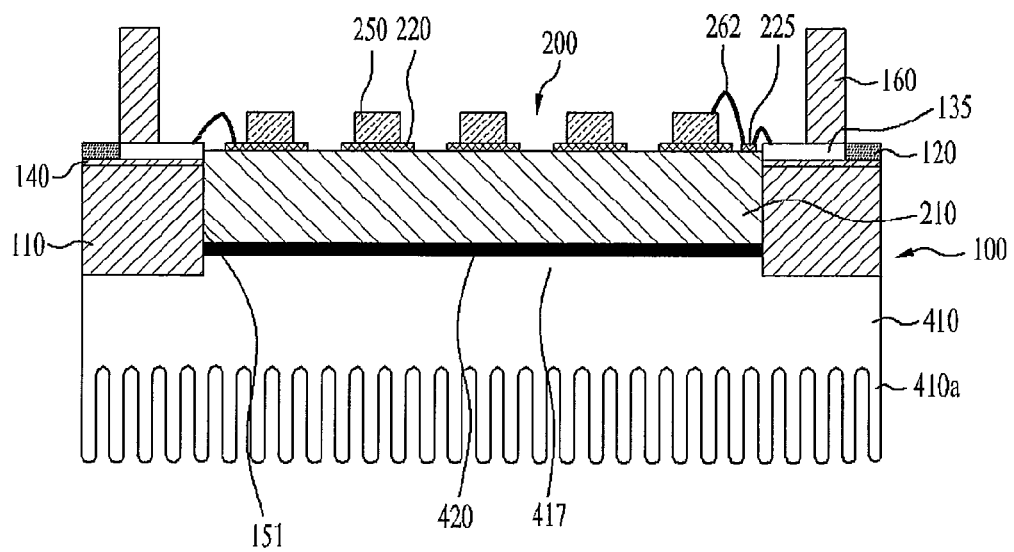
FIG. 14 is a sectional view illustrating a light emitting module according to a ninth embodiment.

FIG. 14 is a sectional view illustrating a light emitting module according to a ninth embodiment.

Referring to FIG. 14, the light emitting module includes a circuit board 100 and a light emitting device package 200 disposed at the circuit board 100.

The light emitting module refers to a structure in which the light emitting device package 200 is mounted on the circuit board 100, and the light emitting device package 200 is similar to the configuration of the first embodiment illustrated in FIG. 1.

The circuit board 100 includes a metal plate 110 having a through hole 151, an insulation layer 140, and a circuit pattern 135.

A heat radiating member 410 is disposed beneath the circuit board 100 and the insulation substrate 210.

The insulation substrate 210 is disposed at a region on the heat radiating member 410, which corresponds to the through hole 151 of the circuit board 100.

A joining structure is disposed between a bottom surface of the insulation substrate 210 and the region on the heat radiating member 410 at which the insulation substrate 210 is disposed. The joining structure includes a heat radiating member protrusion portion 417 formed to protrude from the heat radiating member 410.

The insulation substrate 210 may be joined to the heat radiating member 410 in a state in which the heat radiating member protrusion portion 417 is inserted into the through hole 151 of the circuit board 100. In this case, the insulation substrate 210 may be disposed to come into contact with an inner side surface of the through hole 151 without being disposed to be spaced apart from the through hole 151, in order to more securely join the heat radiating member 410 and the insulation substrate 210.

Figure 15:
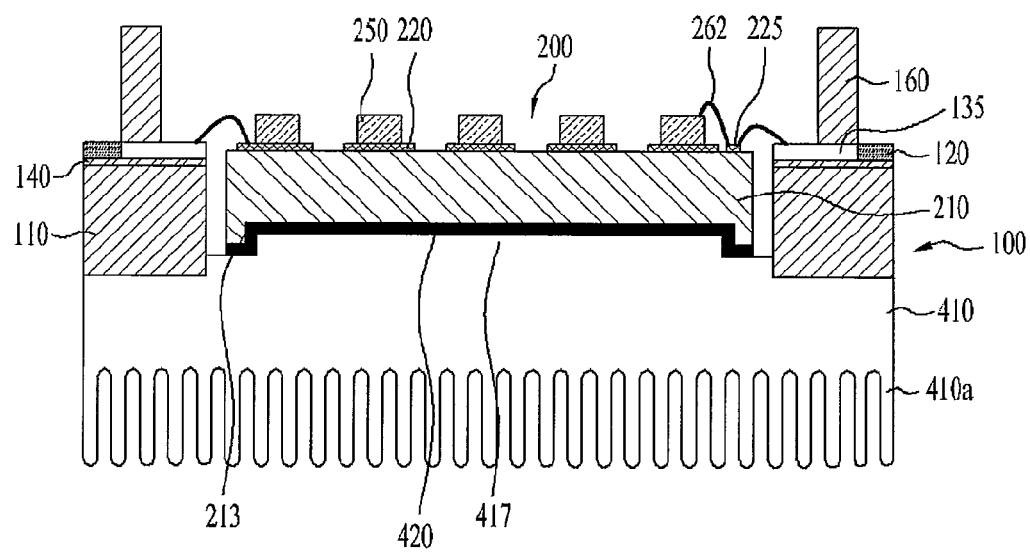
FIG. 15 is a sectional view illustrating a light emitting module according to a tenth embodiment.

FIG. 15 is a sectional view illustrating a light emitting module according to a tenth embodiment.

Referring to FIG. 15, the light emitting module includes a circuit board 100 and a light emitting device package 200 disposed at the circuit board 100.

The light emitting module refers to a structure in which the light emitting device package 200 is mounted on the circuit board 100, and the light emitting device package 200 is similar to the configuration of the first embodiment illustrated in FIG. 1.

The circuit board 100 includes a metal plate 110 having a through hole 151, an insulation layer 140, and a circuit pattern 135.

A heat radiating member 410 is disposed beneath the circuit board 100 and the insulation substrate 210.

The insulation substrate 210 is disposed at a region on the heat radiating member 410, which corresponds to the through hole 151 of the circuit board 100.

A joining structure is disposed between a bottom surface of the insulation substrate 210 and the region on the heat radiating member 410 at which the insulation substrate 210 is disposed.

The joining structure includes a heat radiating member protrusion portion 417 formed to protrude from the heat radiating member 410 and an insulation substrate recess portion 213 formed to be recessed from the bottom surface of the insulation substrate 210.

The heat radiating member protrusion portion 417 is formed at a position corresponding to the insulation substrate recess portion 213, and the heat radiating member protrusion portion 417 is joined to the insulation substrate recess portion 213, thereby enabling enlargement of a contact area and improvement in heat radiating efficiency of the light emitting module.

The insulation substrate recess portion 213 may consist of a plurality of recess portions separated from one another or one integrated recess portion.

On the other hand, the heat radiating member protrusion portion 417 may also consist of a plurality of protrusion portions separated from one another or one integrated protrusion portion.

Figure 16:
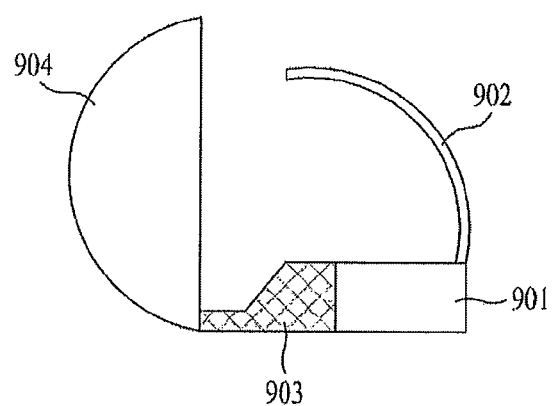
FIG. 16 is a view illustrating a head lamp according to an exemplary embodiment, in which the light emitting module according to the above-mentioned embodiments is included.

FIG. 16 is a view illustrating a head lamp according to an exemplary embodiment, in which the light emitting module according to the above-mentioned embodiments is included.

Referring to FIG. 16, light, which passes through a glass cover of a light emitting module 901 according to the above-mentioned embodiments, is reflected by a reflector 902 and a shade 903 and then passes through a lens 904, so as to be directed forward of a vehicle body.

The lens 904 serves to refract light emitted from the light emitting module 901 and light reflected by the reflector 902.

As is apparent from the above description, a light emitting device package is mounted in a cavity or a through hole of a circuit board, such that heat radiating efficiency of a light emitting module may be improved and element reliability may be attained.

Also, a protrusion/recess structure is formed between a light emitting device package and a circuit board or between a light emitting device package and a heat radiating member, thereby enabling enlargement of a contact area and more improvement in heat radiating efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
a circuit board having a first region and a second region, the first region not overlapping the second region, the first region having a cavity and the second region having a circuit pattern;
an insulation substrate disposed in the cavity;
at least one pad disposed on the insulation substrate; and
at least one light emitting device disposed on the pad,
wherein a joining structure is disposed between a bottom surface of the cavity and a bottom surface of the insulation substrate.

2. The light emitting module according to claim 1, wherein the joining structure comprises:
at least one cavity recess portion formed to be recessed from the bottom surface of the cavity; and
at least one insulation substrate protrusion portion formed to protrude from the bottom surface of the insulation substrate,
wherein a bottom surface of the insulation substrate protrusion portion contacts a top surface of the cavity recess portion.

3. The light emitting module according to claim 1, wherein the joining structure comprises at least one cavity protrusion portion formed to protrude from the bottom surface of the cavity and at least one insulation substrate recess portion formed to be recessed from the bottom surface of the insulation substrate.

4. The light emitting module according to claim 1, wherein the joining structure has at least one of a circular, square, or spiral shape.

5. The light emitting module according to claim 1, further comprising a conductive pad for electrically connecting the circuit pattern and the pad.

6. The light emitting module according to claim 1, further comprising a glass cover disposed over the circuit board.

7. The light emitting module according to claim 1, further comprising a barrier disposed on the circuit board to enclose the cavity.

8. The light emitting module according to claim 7, further comprising a glass cover disposed on the barrier.

9. The light emitting module according to claim 7, wherein the pad and the circuit pattern are electrically connected by a wire, and
wherein a height of a top surface of the barrier is higher than a top surface of the circuit board and a top surface of the wire.

10. A light emitting module comprising:
a circuit board having a first region and a second region, the first region not overlapping the second region, the first region having a through hole and the second region having a circuit pattern;
a heat radiating member disposed on the circuit board;
an insulation substrate disposed at the first region;
at least one pad disposed on the insulation substrate; and
at least one light emitting device disposed on the pad, wherein a joining structure is disposed between a region on the heat radiating member corresponding to the through hole and a bottom surface of the insulation substrate, and wherein the joining structure comprises:
  at least one heat radiating member recess portion formed to be recessed from the region on the heat radiating member corresponding to the through hole; and
  at least one insulation substrate protrusion portion formed to protrude from the bottom surface of the insulation substrate,
  wherein a bottom surface of the at least one insulation substrate protrusion portion contacts a top surface of the at least one heat radiating member recess portion.

11. The light emitting module according to claim 10, wherein the joining structure comprises at least one heat radiating member protrusion portion formed to protrude from the region on the heat radiating member corresponding to the through hole.

12. The light emitting module according to claim 11, further comprising at least one insulation substrate recess portion formed to be recessed from the bottom surface of the insulation substrate.

13. The light emitting module according to claim 10, further comprising a thermally conductive member disposed between the insulation substrate and the heat radiating member.

14. The light emitting module according to claim 10, further comprising a conductive pad for electrically connecting the circuit pattern and the pad.

15. The light emitting module according to claim 10, further comprising a glass cover disposed on the circuit board.

16. The light emitting module according to claim 10, wherein the heat radiating member has, at a lower surface thereof, a plurality of heat radiating fins.

17. The light emitting module according to claim 10, further comprising a barrier disposed on the circuit board to enclose the through hole.

18. The light emitting module according to claim 17, wherein the pad and the circuit pattern are electrically connected by a wire, and
  wherein a height of a top surface of the barrier is higher than a top surface of the circuit board and a top surface of the wire.

19. A light emitting module comprising:
  a circuit board comprising a metal plate, an insulation layer on the metal plate, and a circuit pattern on the insulation layer;
  an insulation substrate disposed on the circuit board while being formed, at an upper portion thereof, with at least one pad;
  at least one light emitting device disposed on the pad, the pad and the circuit pattern electrically connected by a wire;
  a barrier disposed on the circuit board, and a height of a top surface of the barrier is higher than a top surface of the circuit board and a top surface of the wire; and
  a joining structure disposed between an upper surface of the circuit board and a bottom surface of the insulation substrate,
  wherein the joining structure comprises:
    a circuit board recess portion formed by removing at least a portion of the insulation layer of the circuit board, and
    at least one insulation substrate protrusion portion protruding from the bottom surface of the insulation substrate,
    wherein a bottom surface of the at least one insulation substrate protrusion portion directly contacts a top surface of the circuit board recess portion.

20. The light emitting module according to claim 19, further comprising a glass cover disposed on the circuit board.

* * * * *